United States Patent [19]
Genesi

[11] 3,940,785
[45] Feb. 24, 1976

[54] SEMICONDUCTOR I.C. WITH PROTECTION AGAINST REVERSED POWER SUPPLY

[75] Inventor: Robert C. Genesi, Sterling, Mass.

[73] Assignee: Sprague Electric Company, North Adams, Mass.

[22] Filed: May 6, 1974

[21] Appl. No.: 467,179

[52] U.S. Cl............... 357/48; 307/202 R; 307/296; 307/303; 307/317 A; 357/15; 357/51
[51] Int. Cl.² H01L 27/04; H02H 7/20; H02H 3/18; H01L 29/48
[58] Field of Search........ 357/48, 15; 307/202, 303, 307/296, 317 A, 202 R

[56] References Cited
UNITED STATES PATENTS

| | | | |
|---|---|---|---|
| 3,541,357 | 11/1970 | Kram | 307/303 |
| 3,562,547 | 2/1971 | Brode | 307/303 |
| 3,649,883 | 3/1972 | Augustine | 357/15 |
| 3,649,887 | 3/1972 | Keller et al. | 307/303 |
| 3,737,742 | 6/1973 | Breuer et al. | 357/15 |
| 3,829,709 | 8/1974 | Maigret et al. | 357/48 |

Primary Examiner—William D. Larkins
Attorney, Agent, or Firm—Connolly and Hutz

[57] ABSTRACT

A semiconductor integrated circuit includes an integrated resistor body of one conductivity type being contained in a lightly doped pocket of the opposite conductivity type. A metal contact is made to a surface portion of the lightly doped pocked forming a Schottky diode. The metal contact is connected to the hot (Vcd) power supply terminal and thus the diode is normally forward biased. When the power supply is inadvertently reversed, the Schottky diode is reverse biased and prevents destructive currents from flowing in a forward biased p-n isolation junction between the substrate and the pocket.

7 Claims, 4 Drawing Figures

SEMICONDUCTOR I.C. WITH PROTECTION AGAINST REVERSED POWER SUPPLY

BACKGROUND OF THE INVENTION

The present invention relates to semiconductor integrated circuits and more particularly to an integrated circuit having protection against a reverse connected power supply.

Integrated circuits (IC's) are typically designed to perform digital or analogue circuit functions. Their small size makes them especially suitable for incorporation in portable equipment, which is typically powered by batteries. In these battery powered applications, the danger exists that when replacing a used battery with a fresh one, the new battery may be connected backward from normal. Most semiconductor integrated circuits are so constructed that a polarity reversal of the d.c. power source will cause permanent and catastrophic damage to the circuit components. It is desirable that low cost protective means against an inadvertently reversed battery, be provided within the integrated circuit itself. A known means for accomplishing this, comprises forming by standard IC methods a normal p-n junction diode in the circuit substrate and connecting this diode in series relationship with the d.c. power supply (battery) and d.c. power buss terminals of the primary portion of the IC. The diode is polarized so that it is "forward biased" when the battery is properly connected and vice versa.

Unfortunately the simplest and most straightforward means for fabricating the diode often results in the inadvertent formation of a parasitic bipolar transistor or an SCR that degrades the performance of the primary circuit. Such is likely to be the case, for example, when the diode is formed in a portion of the isolated pocket containing a collector resistor. The hazard also exists when forming the protective diode in a portion of the collector region of a transistor. Furthermore, even if through good fortune or special design the formation of a parasitic transistor is avoided, the forward drop ($V_{BE}$) of the p-n diode in normal operation is about 0.6 volts for silicon and the effective d.c. supply voltage, that is available to the primary portion of the I.C., is diminished by 0.6 volts. This loss may be intolerable where the circuit is intended to use a low voltage supply, for example, as provided by two or even three series connected dry cells of 1.5 volts each.

It is therefore an object of this invention to provide within an I.C. a reverse battery protection means, without creating parasitic transistors.

It is a further object of this invention to provide within an I.C. a reverse battery protection means, with a minimum reduction in the effective d.c. power supply voltage.

It is yet a further object of this invention to provide a simple low cost reverse battery protective means in an I.C.

SUMMARY OF THE INVENTION

An integrated circuit comprises a semiconductor substrate of one conductivity type having a pocket of opposite conductivity type formed therein and a region of one type conductivity contained within said pocket. The region of one conductivity type forms a resistor body and has two ohmic contacts made thereto. The impurity concentration of opposite type in the pocket is small enough that a metal contact made thereto forms a Schottky diode therewith. A connection is made between the hot power supply terminal and the metal contact of the Schottky diode, and a connection is made between the substrate and the ground power supply terminal such that when the power supply is connected normally, the p.n. junctions between the resistor body and the pocket and between the substrate and the pocket are completely back biased; but also such that when the power supply is inadvertently back biased the p.n. junction between the substrate and the pocket is protected by the back biased Schottky from drawing large currents and thus is protected from sustaining damage.

Also a second Schottky diode may similarly be formed in another opposite type conductivity pocket that serves as the collector region of a transistor and the metal contact of the second Schottky connected to the hot power supply terminal such that for normal connection of the power supply the second Schottky diode is forward biased and drops only about 0.2 volts, and the transistor collector is connected thereby to the hot terminal. However, when the power supply is inadvertently reverse connected, the Schottky is reverse biased and damage is prevented to the p-n junction between the substrate and the collector pocket.

DESCRIPTION OF THE PREFERRED EMBODIMENTS

Figure 1:
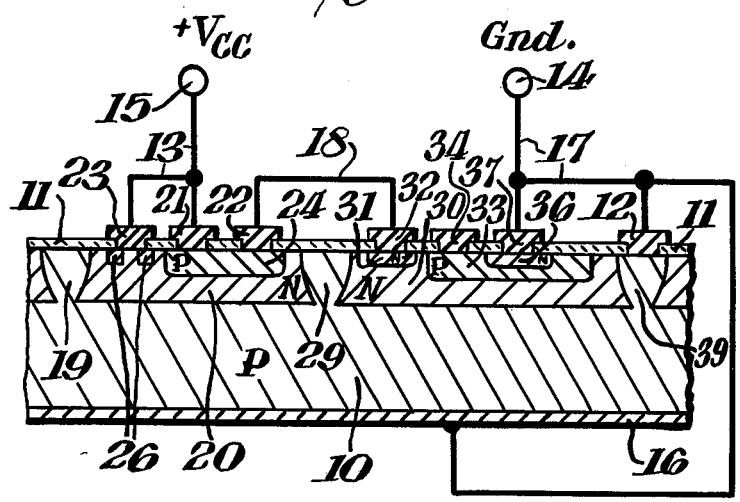
In FIG. 1 is shown in cross sectional view a semiconductor integrated circuit representing a first preferred embodiment of this invention.
Figure 2:
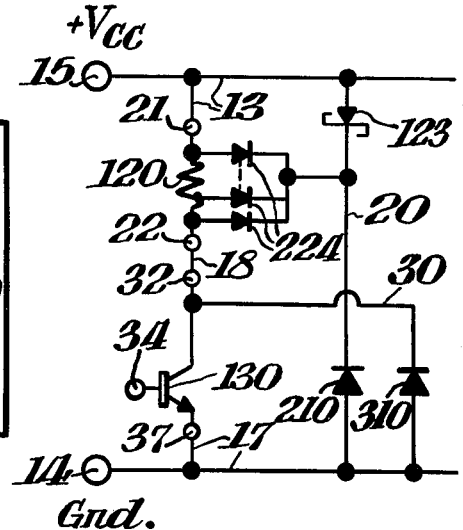
In FIG. 2 is shown a circuit diagram of the device of FIG. 1.
Figure 3:
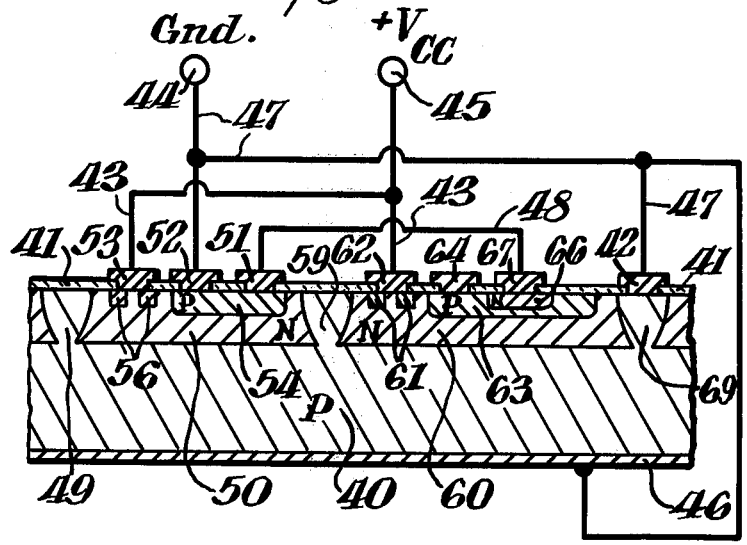
In FIG. 3 is shown in cross sectional view a semiconductor integrated circuit representing a second preferred embodiment of this invention.
Figure 4:
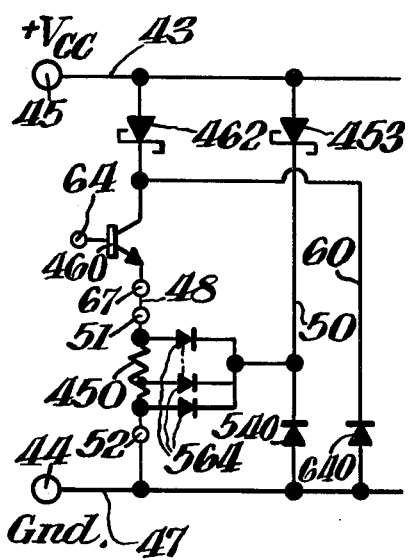
In FIG. 4 is shown a circuit diagram of the device of FIG. 3.

In a first preferred embodiment of the present invention, an integrated circuit amplifier is formed in a silicon substrate 10 of FIG. 1 having a corresponding circuit diagram as shown in FIG. 2.

The substrate 10 has P-type bulk impurities contained therein and has grown at the top surface an epitaxial layer of N-type silicon. Spaced pockets 20 and 30 consisting of portions of the N-type epitaxial layer are formed by the standard process of an isolation diffusion of P-type impurities in regions 19, 29 and 39. Buried layers of N+ material (not shown) may be formed at the planar interface between each of the N pockets 20 and 30, and the underlying P type substrate 10.

The pocket 30 becomes the collector region of transistor 130, a P type base region 33 being formed within this pocket 30, and subsequently an N type emitter region 36 being formed within the base region 33. In another portion of the collector region 30 there is formed at the surface a heavily doped region 31 of N type impurities.

In the other epitaxial pocket 20 there is formed a P type region 24 that serves as the body of the resistor 120. In another portion of the pocket 20 there is formed an annular region 26 of P type material lying parallel to and adjacent to the substrate surface.

A layer 11 of silicon dioxide is formed over the epitaxial surface of the substrate and holes in this insulative layer 11 are provided at selected positions into which aluminum is deposited for making contact to selected surface areas of the doped epitaxial regions aforementioned. Thus two spaced contacts 21 and 22 are made to the P type resistor body region 24, constituting the terminals therefor; a collector terminal 32 contacts the N+ region 31; a base terminal 34 contacts the base region 33; an emitter terminal 37 contacts the emitter region 36; and a contact 12 is made to at least one of the heavily doped isolation regions as for example region 39. The doped regions 24, 31, 33, 36 and 39 all have impurity concentrations that are high enough that the aluminum contacts thereto are all ohmic, that is, nonrectifying.

However, the isolated epitaxial pocket 20 contains N type impurities of low enough concentration that a metal terminal 23 forms a rectifying contact at the interface therebetween. Thus a Schottky barrier diode 123 is formed that is forward biased with a positive voltage at the terminal 23 relative to the pocket 20. The doped guard ring 26 serves, as is well known, to reduce the reverse leakage of the Schottky diode 123.

The resistor 120 and the transistor 130 are interconnected, and further connected to other terminals that are externally accessible such as to metal leads of the IC package. At least two such externally accessible terminals are required for connection to a d.c. power supply. One such terminal 14 is a "ground" terminal and the other terminal 15 is a "hot" terminal normally held at $V_{cc}$ with respect to ground. For the IC of FIGS. 1 and 2, the hot terminal 15 would normally be positive.

The network of metal conductors is normally formed partly by layers of aluminum (as represented for example by the schematically drawn connection 18), disposed over the insulative oxide layer 11 and contacting certain terminals such as 22 and 32; and partly by wires (e.g. 13) being thermal compression bonded to an IC substrate terminal such as 21 and an externally accessible terminal 15. Optionally included in the network of the first preferred embodiment is a layer of gold 18 having been deposited to the underneath surface of substrate 10, and a connection 17 therefrom to substrate terminal 12. The underneath body surface may alternatively be lapped and scrub bonded at about 430°C to a gold plated metal pad thus simultaneously mounting or die bonding the chip and making a broad electrical connection to the body. Terminal 12 is connected to emitter terminal 37 and to externally accessible terminal 14. The connection 13 also ties the Schottky diode terminal 23 to the hot terminal 15.

Except for the Schottky diode 123, the structure of FIG. 1 is familiar to the art. Typically in place of the diode 123 an ohmic contact is conventionally made to the isolated epitaxial region 20, which would be connected as by a wire 13 to the hot terminal 15. This would be intended to hold the PN junction (224 as schematically represented in FIG. 2) in a back biased condition under normal IC operating conditions. According to the principles of the present invention in an isolation region (20 in FIG. 1) containing a resistor body (24) there is formed a Schottky diode that is connected to the hot terminal of the IC, with the following advantageous and surprising results. Since the forward drop across a Schottky diode is about 0.2 volts while the forward drop across a P-N junction diode in silicon is approximately 0.6 volts, then during normal operation of the IC the Schottky diode 123 is always forward biased while the junction 224 between resistor body 24 and region 20 is always reverse biased, and the resistor body 24 is under normal conditions electrically isolated from the surrounding region of semiconductor material as it would also be in the above described conventional IC structure. However, when the power supply voltage is inadvertently reversed, the region 20 would be at ground potential, the substrate 10 would be at $V_{cc}$ potential and the PN junction (diode 210 in FIG. 2) therebetween would be forward biased and thus be subject to damage and failure due to the large currents that would tend to flow in this low impedance path. For the IC structure of the present invention as represented in FIGS. 1 and 2, an inadvertent reversal of supply voltage would merely back bias the Schottky diode and protect the structure from any damaging effects. The isolation P-N junction (diode 310 in FIG. 2) between the collector region 30 and the substrate 10 is, in this circuit, already adequately protected since the resistor 120 limits the current that can flow in the forward biased isolation-diode 310 when the supply is reversed.

If a P-N junction diode had been formed in the region 20, substituting for the protective Schottky diode 123 of this invention, there would be for proper connection to the power supply, certain conditions of zero or low collector current for which a significant portion of the isolation diode 224 would be forward biased and consequently unwanted currents would bypass portions of the resistor body to the hot terminal 15. Thus a PN junction diode is clearly unsuitable for this purpose. Also as has been explained, the formation of a PN diode in this location tends to create a parasitic transistor and the injection of charge into the substrate 10 causing a further degradation in the circuit performance.

In a second preferred embodiment of the present invention, an integrated circuit power amplifier or emitter follower is formed in a silicon substrate 40 of FIG. 1. The corresponding circuit diagram is shown in FIG. 2.

The substrate 40 has P-type impurities contained therein and has grown at the top surface an epitaxial layer of N-type silicon. Spaced pockets 50 and 60 each comprising portions of the N-type epitaxial layer are formed by the standard process of isolation diffusion of P-type impurities in regions 49, 59 and 69.

The pocket 60 becomes the collector region of transistor 460, a P-type base region 63 being formed within this pocket 60, and an N-type emitter region 66 being formed within the base region 63. In another portion of the collector pocket 60 there is formed at the surface an annular guard region 61 of P-type material. In the other epitaxial pocket 50 there is formed a P-type region 54 that serves as the body of the resistor 450. In another surface portion of the pocket 50 a P-type guard ring 56 is formed.

A layer 41 of silicon dioxide is formed over the epitaxial silicon surface and through holes in the oxide layer aluminum is deposited forming terminals 53, 52, 51, 62, 64, 67 and 42; one for a Schottky diode 453, two for the resistor 450, one for a Schottky diode 462, one for the base of transistor 460, one for the emitter of transistor 460 and one for a substrate contact in the region 69, respectively.

Doped regions 54, 63, 66 and 69 have impurity concentrations high enough that the aluminum terminals 51-52, 64, 67 and 42, respectively, all make ohmic contact thereto. The epitaxial regions 50 and 60 have impurity concentrations low enough that aluminum terminals 53 and 62, respectively, make rectifying contact thereto.

Externally accessible dc power supply terminals 44 and 45 are provided for connection to a d.c. power supply (not shown) with terminal 44 the ground and 45 being the "hot" or $V_{cc}$ terminal. In this embodiment $V_{cc}$ is properly positive.

A conductor network includes electrical interconnections for completion of the fully functional integrated electronic circuit which in this embodiment is an emitter follower, and for providing terminals (44 and 45) so that the I.C. is capable of connection to a d.c. power supply. Connections (e.g. 47 and 43) from the terminals 44 and 45 are each preferably a fine wire thermally compression bonded to a substrate contact such as 52 and 62. The remaining connections consisting in portions of 43 and 47 are preferably made by continuous runs of aluminum layers overlying the oxide layer 11. In addition a gold layer 46 is deposited to the underneath side of the substrate 40 and is grounded by another thermal compression bonded wire portion of interconnection 47. Alternatively, layer 46 is omitted and no connection is made to the underside of the substrate, or the underside of the substrate is die bonded at an elevated temperature to a gold plated lead frame by a standard scrub method and subsequently connected to by interconnection 47.

As in the first preferred embodiment a P-type resistor body 54 is formed in an N-type pocket 50 and a Schottky diode 453 is formed at another portion of that pocket by depositing an aluminum contact 53 directly thereto. The metal terminal 53 of the Schottky diode 453 is connected to the hot terminal 45, thus insuring a reverse bias over the complete p-n junction 564 between the resistor body 54 and the pocket during normal operation, and also providing protection to the n-p isolation junction 540 between pocket 50 and P-type substrate 40, respectively, when the power supply is inadvertently connected in the reverse polarity. However, in this circuit of the second preferred embodiment, the N-type collector pocket 60 is also connected through a Schottky diode 462 to the hot terminal 45 of the I.C. in place of the conventional ohmic collector to $V_{cc}$ connection made in standard emitter follower circuits. Although this results in a reduced effective $V_{cc}$ (by 0.2 volts), as seen by the emitter follower circuit, protection is provided, when the power supply is reversed, against damage to the n-p junction 640 between the collector pocket 60 and the substrate 40.

In general it can be seen that the addition of protective Schottky diodes to an I.C. as taught herein may require additional chip "real estate", and requires no additional processing step since Schottky guard rings may be diffused simultaneously with transistor bases. Therefore, the incorporation of protective Schottky diodes to an integrated silicon circuit according to the principles of this invention may be accomplished without any added manufacturing costs.

It is well known that a metal contact to a heavily doped semiconductor provides an ohmic non-rectifying junction, whereas a metal contact to a lightly doped semiconductor provides a rectifying junction commonly known as a Schottky diode. A paper dealing with this art is the Metal-Semiconductor Contact by A. Y. C. Yu, IEEE Spectrum — March 1970, pp 83–89. In this paper, The Specific Contact Resistance of $Pd_2Si$ Contacts In n- and p- Si, by A. Shepela, Solid State Electronics, 1973, vol. 16 on page 480; the resistivities above which a rectifying junction is formed with aluminum in silicon are given as 0.01 ohm-centimeters for n-type and 1.0 ohm centimeters for p-type. These resistivities are equivalent to $3.5 \times 10^{18}$ and $2 \times 10^{16}$ impurity atoms per cubic centimeter respectively. In conventional integrated circuits, for example having P-type substrates, the concentration of N-type impurity atoms in the epitaxial layer of which the resistor isolation pockets and the transistor collectors may be formed, is typically from 2 to $6 \times 10^{15}$ per cubic centimeter. Therefore additional restraints are not normally imposed upon the I.C. design in the practice of this invention. In fact, only minor changes in the masks used to manufacture a conventional I.C. will be required to incorporate the protective Schottky diodes of this invention.

Prototype integrated circuits were made according to the first preferred embodiment of this invention. On a P-type starting silicon crystal substrate having a resistivity of about 2 ohm-centimeters, there was grown on one surface an N-type epitaxial layer of about 11 microns thickness and having a resistivity of 1 ohm-centimeter (equivalent to an impurity concentration of about $5.6 \times 10^{15}$ impurity atoms per cubic centimeter). In the subsequent standard and well-known steps, an oxide layer was grown over the epitaxial surface through which holes were provided by masking and etching in areas defining the isolation regions 19, 29 and 39; P-type impurities were established in these isolation regions by diffusion through the oxide holes providing heavily doped regions of about $10^{19}$ atoms per cubic centimeter; new holes are provided in the oxide defining the resistor body, the base region of the transistor, and the Schottky diode guard ring; P-type impurities were established in those three regions having a concentration of about $5 \times 10^{17}$ P-type atoms per cubic centimeter; the remaining oxide was removed, a new oxide layer was grown over the surface and holes provided therein defining the emitter region and the region 31 in a portion of the collector; N-type impurities were diffused into these regions providing therein a concentration of about $10^{15}$ N-type atoms per cubic centimeter; the remaining oxide was removed, a new oxide layer grown and holes provided therein at selected areas; a film of aluminum was deposited by vacuum evaporation over the surface contacting the silicon regions at the selected sites of the oxide holes. A photo-resist mask was superimposed and the aluminum removed by etching in the unwanted areas.

The prototype circuits performed normally when supplied by a 3 volt battery. Upon reversing the battery, the current drawn in typically less than the normal forward connected battery current. Thus even when the battery is left reverse connected for an extended period, no damage to the I.C. occurs and the battery is not significantly discharged.

What is claimed is:

1. A semiconductor integrated circuit providing protection against a reversed power supply connection having a semiconductor substrate of one conductivity type, a plurality of spaced regions in said substrate each being adjacent to a common face of said substrate and each containing dopant impurities of a conductivity type opposite to said one type, a resistor being formed in a portion of one of said regions, a transistor being formed in a second of said regions, a conductor network connective means, including a terminal connected to said substrate; a terminal adapted to be connected to a fixed d.c. voltage source with respect to said substrate terminal and a connection between said resistor and said fixed voltage terminal, for the purpose of completing the connections in said semiconductor integrated circuit; wherein the improvement comprises a Schottky diode being formed by a metal layer contacting another portion of said one region, said metal layer being electrically connected to said fixed voltage terminal.

2. An integrated circuit providing protection against a reverse power supply connection comprising:
   a. a silicon substrate of one conductivity type;
   b. a plurality of spaced pockets being formed in said substrate, each said pocket extending to the surface thereof and containing dopant impurities of the opposite conductivity type;
   c. a first bipolar planar transistor formed in a first of said pockets having ohmic contacts made thereto at said surface;
   d. a resistor formed in a portion of a second of said pockets, said resistor portion extending to said surface and containing dopant impurities of said one conductivity type, said resistor portion having two spaced ohmic contacts made thereto at said surface;
   e. an electrical connective means external to said substrate, including a connection between one of said transistor ohmic contacts to one of said resistor ohmic contacts, and including a terminal connected to said substrate and a terminal adapted to be connected to a fixed d.c. voltage source with respect to said substrate terminal for the purpose of forming a functional integrated electronic circuit capable of being connected to and powered by said fixed voltage source; and
   f. a metal layer contacting another portion of said second pocket at said surface, the concentration of said dopant impurities in said second pocket being low enough that a Schottky type rectifying junction is formed at the interface between said second pocket and said metal layer, said connective means further including a connection between said metal layer and said fixed voltage terminal for the purpose of providing protection to said circuit when said voltage source is inadvertently reverse connected to said terminals.

3. The integrated circuit of claim 2 wherein said one conductivity type is P-type, said metal layer is aluminum, said dopant impurities of opposite conductivity type in said second pocket are N-type, and said dopant impurity concentration is less than $3.5 \times 10^{18}$ atoms per cubic centimeter.

4. The integrated circuit of claim 2 wherein said one conductivity type is N-type, said metal layer is aluminum, said dopant impurities of opposite conductivity type of said second pocket are P-type, and the P-type dopant impurity concentration is less than $2 \times 10^{16}$ atoms per cubic centimeter.

5. An integrated circuit providing protection against a reversed power supply connection comprising:
   a. silicon substrate of one conductivity type;
   b. a plurality of spaced pockets being formed in said substrate and extending to the surface thereof and containing dopant impurities of the opposite conductivity type;
   c. a first bipolar planar transistor formed in a first of said pockets having ohmic contacts made to the emitter and the base of said transistor;
   d. a resistor formed in a portion of a second of said pockets, said resistor portion extending to said surface and containing dopant impurities of said one conductivity type, said resistor portion having two spaced ohmic contacts made thereto at said surface;
   e. an electrical connective means external to said substrate including a connection between said transistor emitter contact and one of said resistor contacts, and including a terminal connected to said substrate and a terminal adapted to be connected to a fixed d.c. voltage source with respect to said substrate terminal for the purpose of forming a functional integrated electronic circuit capable of being connected to and powered by said fixed voltage source;
   f. one metal layer contacting another portion of said second pocket at said surface, the concentration of said dopant impurities in said second pocket being low enough that a Schottky type rectifying junction is formed at the interface between said second pocket and said metal layer, said connective means further including a connection between said one metal layer and said fixed voltage terminal for the purpose of providing protection to the isolation p-n junction between said substrate and said second pocket when said voltage source is inadvertently reverse connected to said terminals; and
   g. another metal layer contacting a collector portion of said first pocket at said surface, the concentration of said dopant impurities in said collector portion of said first pocket being low enough that a Schottky type rectifying junction is formed at the interface between said first pocket and said another metal layer, said connective means further including a connection between said another metal layer and said fixed voltage terminal for the purpose of providing protection to the isolation p-n junction between said substrate and said first pocket when said voltage source is inadvertently reverse connected to said terminals.

6. The integrated circuit of claim 5 wherein said substrate is P-type silicon, said one and another metal layers are aluminum, said opposite conductivity type of said pockets is N-type, and said N-type dopant impurity concentration therein is less than $3.5 \times 10^{18}$ atoms per cubic centimeter.

7. The integrated circuit of claim 5 wherein said substrate is N-type silicon, said one and another metal layers are aluminum, said opposite conductivity type of said pockets are P-type, and said dopant impurity concentration therein is less than $2 \times 10^{16}$ atoms per cubic centimeter.

* * * * *